United States Patent [19]
Lin et al.

[11] Patent Number: 5,841,818
[45] Date of Patent: Nov. 24, 1998

[54] DECODING METHOD FOR TRELLIS CODES EMPLOYING A CONVOLUTIONAL PROCESSOR

[75] Inventors: Mao-Chao Lin, Taipei Hsien; Jia-Yin Wang, Taipei, both of Taiwan

[73] Assignee: Chung-Chin Chen, Alexandria, Va.

[21] Appl. No.: 587,478

[22] Filed: Jan. 17, 1996

[51] Int. Cl.⁶ .................................................. H03M 13/12
[52] U.S. Cl. ...................... 375/341; 375/262; 375/265; 371/43.4; 371/43.6; 371/43.7; 371/43.8
[58] Field of Search ..................... 375/262, 265, 375/341; 371/43, 43.1, 43.4, 43.6, 43.7, 43.8

[56] References Cited

U.S. PATENT DOCUMENTS

| | | | |
|---|---|---|---|
| 4,888,775 | 12/1989 | Karabed et al. | 371/43 |
| 5,181,208 | 1/1993 | Hagenauer et al. | 371/43 |
| 5,406,570 | 4/1995 | Berrou et al. | 371/43 |
| 5,414,738 | 5/1995 | Bienz | 375/341 |
| 5,581,568 | 12/1996 | Togami | 371/43 |
| 5,619,167 | 4/1997 | Adachi | 329/304 |

OTHER PUBLICATIONS

Dimakis, C.E., Kouris, S.S. and Avramis, S.K., "Performance Evaluation of Concatenated Coding Schemes on Multilevel QAM Signalling in Non–Gaussian Products Environment," IEE Proceedings, Part I: Communications, Speech and Vision, vol. 140, No. 4, pp. 269, Aug. 1993.

*Primary Examiner*—Stephen Chin
*Assistant Examiner*—Jeffrey W. Gluck
*Attorney, Agent, or Firm*—Bacon & Thomas

[57] ABSTRACT

A trellis code of a special class is encoded by employing a binary convolutional code with a small constraint length, followed by a convolutional processor and a signal mapper. The trellis code is decoded by the trellis of the binary convolutional code.

9 Claims, 6 Drawing Sheets

| | | | | | | | |
|---|---|---|---|---|---|---|---|
| $s_1$ | $\tilde{s}(t)$ $v_1(t-4\lambda)$ $\oplus$ $v_2(t-3\lambda)$ | $\tilde{s}(t+1\lambda)$ $v_1(t-3\lambda)$ $\oplus$ $v_2(t-2\lambda)$ | $\tilde{s}(t+2\lambda)$ $v_1(t-2\lambda)$ $\oplus$ $v_2(t-1\lambda)$ | $\tilde{s}(t+3\lambda)$ $v_1(t-1\lambda)$ $\oplus$ $v_2(t)$ | $\tilde{s}(t+4\lambda)$ $v_1(t)$ $\oplus$ $v_2(t+1\lambda)$ | $\tilde{s}(t+5\lambda)$ $v_1(t+1\lambda)$ $\oplus$ $v_2(t+2\lambda)$ | $\tilde{s}(t+6\lambda)$ $v_1(t+2\lambda)$ $\oplus$ $v_2(t+3\lambda)$ |
| $s_2$ | $v_3(t-1\lambda)$ | $v_2(t)$ | $v_2(t+1\lambda)$ | $v_2(t+2\lambda)$ | $v_2(t+3\lambda)$ | $v_2(t+4\lambda)$ | $v_2(t+5\lambda)$ |
| $s_3$ | $v_3(t)$ | $v_3(t+1\lambda)$ | $v_3(t+2\lambda)$ | $v_3(t+3\lambda)$ | $v_3(t+4\lambda)$ | $v_3(t+5\lambda)$ | $v_3(t+6\lambda)$ |

DECODING METHOD FOR TRELLIS CODES EMPLOYING A CONVOLUTIONAL PROCESSOR

BACKGROUND OF THE INVENTION

In a digital communication system, the transmission of information will be corrupted by channel noise or other channel defects and hence transmission errors are likely to occur. In a digital communication system which requires high reliability, channel coding is usually needed to lower the probability of transmission errors. In a channel coding design, each unit or bit of digitized information will be mapped into a corresponding codeword (or code path). The set of all codewords is called a code. The distance property among codewords of a code can be used to correct transmission errors. In this way, the transmission reliability can be increased. The mapping between the set of information units or bits and the set of codewords is called "coding" or "encoding". If the symbols in each codeword are binary symbols, the channel coding is a binary coding. Sometimes, the mapping is also referred to as a "code". The procedure of recovering the information from the received symbols which are possibly error-corrupted is called "decoding".

The binary trellis code is a frequently used channel coding technique. For a rate k/n binary trellis code, for each time unit, k information bits are fed into-the encoder which generates n code bits as output. The n code bits depend not only on the k information bits currently used as input to the encoder but also depend on information bits which were used as input to the encoder for some earlier time units. A binary trellis code is hence a kind of code with a memory. The codewords of a binary trellis code can be represented by paths in a trellis. The most important class of binary trellis codes is the binary convolutional code. A binary convolutional code is a linear time-invariant binary trellis code. Binary convolutional codes were introduced several decades ago and are still very popular.

Figure 1:
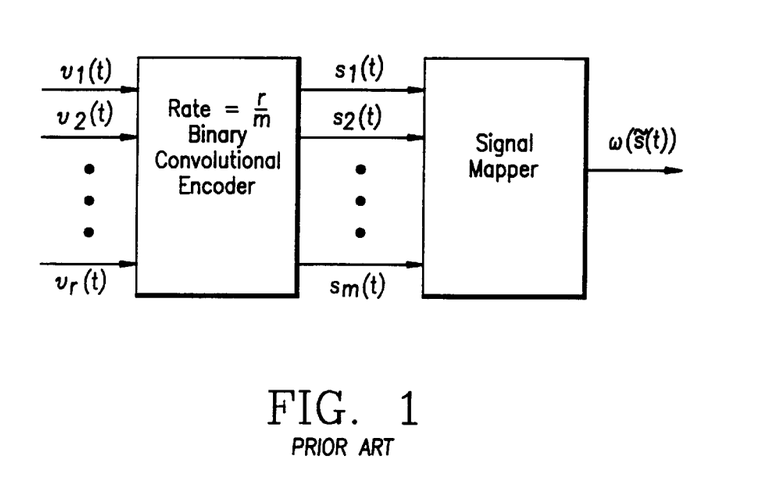
FIG. 1 illustrates the encoding method for the Ungerboeck's TCM.

In the 1982 paper entitled "Channel coding with multilevel/phase signals," published in *IEEE Trans. Inform. Theory.*, vol. 28, no. 1, pp. 55–67, G. Ungerboeck proposed a new idea of channel coding, in which the design of trellis codes and modulation are integrated, called trellis coded modulation (TCM). Consider the signal space 106, which consists of $2^m$ signal points $\{z_1, z_2, \ldots, z_{2^m}\}$. Every signal point z in $\Omega$ corresponds to a unique binary m-tuple $s=(s_1,s_2, \ldots, s_m)$ for $z \in \{z_1, z_2, \ldots, z_{2^m}\}$ and $s_1, s_2, \ldots, s_m \in \{0,1\}$. The encoding of Ungerboeck's TCM having an information rate of r information bits per signal point of $\Omega$ is shown in FIG. 1. During the t-th time unit, the encoder of a binary convolutional code C converts the r-bit information $\tilde{u}(t)=(u_1(t), u_2(t), \ldots, u_r(t))$ into an m-bit output $\tilde{s}(t)=(s_1(t),s_2(t), \ldots, s_m(t))$, which is then mapped into a signal point $\omega(s_1(t),s_2(t), \ldots, s_m(t))=\omega(\tilde{s}(t))$ of the signal space $\Omega$ through a signal mapper S.

Binary trellis codes and trellis coded modulation (TCM) can be combined as a class of codes called trellis codes. The performances of a trellis code are primarily evaluated by three parameters: coding rate, decoding complexity and probability of decoding errors. Designing a trellis code with high coding rate, low decoding complexity and low probability of decoding errors is always a goal in the area of digital communications. To achieve low probability of decoding errors for a trellis coding system, a large free distance is desired, where the free distance of a trellis code is the smallest one of all the possible distances, each of which is measured between a pair of distinct code paths of the trellis code.

Figure 2:
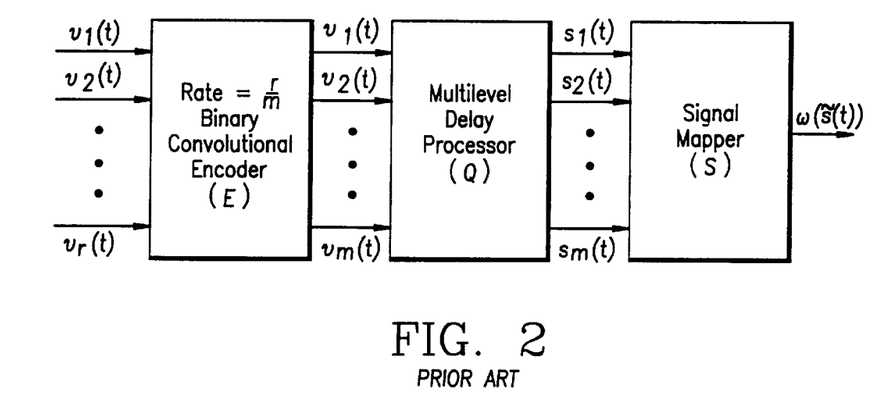
FIG. 2 illustrates the encoding method for the trellis code proposed by Lin and Wang in March 1995.

In 1995, Lin and Wang in their U.S. patent application with application Ser. No. 08/398,797 filed on Mar. 6, 1995, now U.S. Pat. No. 5,570,391, proposed a class of trellis codes for which the encoding can be implemented by introducing a multilevel delay processor Q between the encoder of the binary convolutional code C and the signal mapper S. The encoding is shown in FIG. 2. During the t-th time unit, the encoder of a rate r/m binary convolutional code C converts the r-bit information $\tilde{u}(t)$ into an m-bit output $\tilde{v}(t)=(v_1(t), v_2(t), \ldots, v_m(t))$, which is fed into a multilevel delay processor Q. The output of the multilevel delay processor is $\tilde{s}(t)=(s_1(t), s_2(t), \ldots, s_m(t))$, where $s_p(t)=v_p(t-\Sigma_{i=p}^{m}\lambda_i)$, $1 \le p \le m$, with $\lambda_1, \lambda_2, \ldots, \lambda_m$ being nonnegative constants. Through the signal mapper S, a signal point $\omega(\tilde{s}(t))$ in the signal space $\Omega$ is obtained as the final output symbol. The decoding of the class of trellis codes which can apply the encoding method illustrated in FIG. 2 can be implemented by using the trellis of C.

In this invention, the inventors design a new class of trellis codes for which the encoding can be implemented by modifying the above mentioned method by replacing the multilevel delay processor by a convolutional processor. In this way, a trellis code with a large free distance can be designed even though the constraint length of the binary convolutional code C is small. The inventors also propose a decoding method for the new class of trellis code which uses the trellis of convolutional code C.

SUMMARY OF THE INVENTION

Figure 3:
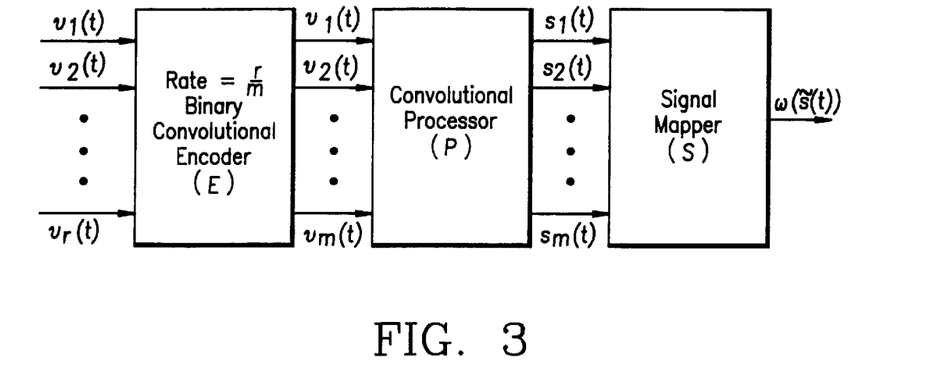
FIG. 3 illustrates an encoding method of the trellis code T suitable for the proposed decoding method.

This invention is a decoding method for the trellis code T for which the encoding can be implemented by first using the encoder E of a rate r/m binary convolutional code C to encode an information sequence $\tilde{u}=\{\ldots, \tilde{u}(t-1), \tilde{u}(t), \ldots\}$ into a sequence $\tilde{v}=\{\ldots, \tilde{v}(t-1), \tilde{v}(t), \ldots\}$ that is sequentially converted into a sequence $\tilde{s}=\{\ldots, \tilde{s}(t-1), \tilde{s}(t), \ldots, \}$ and a sequence $\tilde{\omega}=\{\ldots, \omega(\tilde{s}(t-1)), \omega(\tilde{s}(t)), \ldots\}$ through a convolutional processor P and a signal mapper S, respectively illustrated in FIG. 3, where $\tilde{u}(t)$ is the r-bit information to be encoded during the t-th time unit of encoding, and $\tilde{v}(t), \tilde{s}(t)$ and $\omega(\tilde{s}(t))$ are the associated output symbols of E, P and S respectively. Note that $\tilde{v}(t)$ and $\tilde{s}(t)$ are binary m-tuples and $\omega(\tilde{s}(t))$ can be either a binary m-tuple or a signal point of a signal constellation. The convolutional processor P is in fact an encoder having a rate m/m binary convolutional code, which can be characterized by a transfer function matrix as is described in the 1983 book, *Error Control Coding : Fundamentals and Applications* authored by Shu Lin and Daniel J. Costello, Jr. The transfer function matrix G for the convolutional processor is an m×m matrix for which the entry at the intersection of the p-th row and the q-th column is $g^{(p,q)}(X)$, i.e., $$G=[g^{(p,q)}(X)], p,q \in \{1,2, \ldots, m\}, \qquad (1)$$

where $g^{(p,q)}(X)$ represents the generator sequence (impulse response) for the case in which only the p-th input line of the convolutional processor is used as input and the q-th output line of the convolutional processor is used as output. The parameter $g^{(p,q)}(X)$ is written in polynomial form by $$g^{(p,q)}(X) = \sum_{i=1} a_i^{(p,q)} X^{i\lambda}, 1 \le p \le m \text{ and } 1 \le q \le m, \qquad (2)$$

where $a_i^{(p,q)} \in \{0,1\}$ and $\lambda$ is a positive constant.

Figure 4:
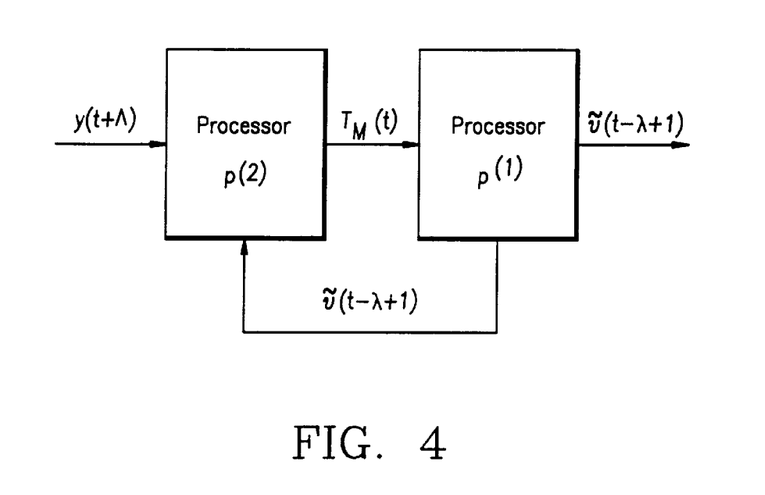
FIG. 4 illustrates the decoding method for the trellis code T.

Referring to FIG. 4, assume that $$\Lambda=\max\{i\lambda: a_i^{(p,q)}=1, 1 \le p \le m, 1 \le q \le m\}.$$

The decoding method is implemented by two processors $P^{(2)}$ and $P^{(1)}$. Let the received symbol be denoted by $y(t)$, which is the possibly noise-corrupted form of the symbol $\omega(\tilde{s}(t))$. The processor $P^{(2)}$ takes the received sequence $\bar{y}= \{\ldots, y(t-1), y(t),y(t+1), \ldots, \}$ as input. Based on $\{\ldots, y(t), \ldots, y(t+\Lambda-1), y(t+\Lambda)\}$ and the transfer function matrix G and $\{\ldots, \tilde{v}(t-\lambda-1), \tilde{v}(t-\lambda.)\}$, the processor $P^{(2)}$ determines $M_{\tilde{v}}(t)$, where $M_{\tilde{v}}(t)$ is the branch metric needed by the decoding trellis code T, for each of the $2^m$ possible values of $\tilde{v}(t)$. Then, the set $T_M(t)=\{M_{\tilde{v}}(t): \tilde{v}(t)\in\{0,1\}^m\}$ is fed into the processor $P^{(1)}$.

The processor $P^{(1)}$ takes the metric sequence $\{\ldots, T_M(t-1), T_M(t)\}$ as input and applies the Viterbi algorithm to the trellis of C to recover the transmitted symbols $\tilde{u}(t-\lambda+1)$ and $\tilde{v}(t-\lambda+1)$ by setting the truncation length of decoding for C to be $\lambda$.

The trellis code T can be generalized in such a way that $g^{(p,q)}(X)$ of the transfer function matrix is modified to be $$g^{(p,q)}(X) = \sum_{i=1} a_i^{(p,q)} X^{i\lambda+n_p}, 1 \leq p \leq m \text{ and } 1 \leq q \leq m, \quad (3)$$

where $n_p$ is a nonnegative constant. Then, in the decoding, the parameter $\Lambda$ is modified to be $$\Lambda=\max\{n_p+i\lambda: \alpha_i^{(p,q)}=1, 1\leq p\leq m, 1\leq q\leq m\}.$$

Note that if $g^{(p,q)}(X)=0$ for $p\neq q$ and $g^{(p,p)}(X)=X^{r_p\lambda+n_p}$ for $1\leq p\leq m$, then trellis code T becomes a trellis code described in the U.S. Pat. No. 5,570,391, where $r_p$ is a nonnegative constant. Hence, this invention is restricted to the case that $g^{(p,q)}(X)$ is nonzero for some pair of $(p,q)$ with $p\neq q$.

DESCRIPTION OF THE PREFERRED EMBODIMENT

The preferred embodiment shows that it is possible to design a trellis code with a large free distance, which can be encoded by using the multilevel encoding method illustrated in FIG. 3. This embodiment demonstrates the powerful capabilities of the proposed decoding method.

The signal space $\Omega$ which consists of $2^m$ signal points $z_1, z_2, \ldots, z_{2^m}$ can be partitioned into an m-level structure such that each signal point $z$ corresponds to a unique binary m-tuple $\tilde{s}=(s_1,s_2,\ldots,s_m)$ for $z\in\{z_1,z_2,\ldots,z_{2^m}\}$ and $s_1, s_2, \ldots, s_m\in\{0,1\}$. Let the mapping relation between z and $\tilde{s}$ be $\omega(\tilde{s})=z$. The level distance $\Delta_p$ of the signal space $\Omega$ is defined as follows:

$$\Delta_p = \begin{cases} \min\{\Delta(z,z'): z, z'\in\Omega, z\neq z'\} & p=1, \\ \min\{\Delta(z,z'): z, z'\in\Omega, z\neq z' \text{ and } s_j=s'_j \text{ for } 1\leq j<p\} & 1<p\leq m. \end{cases}$$

Figure 5:
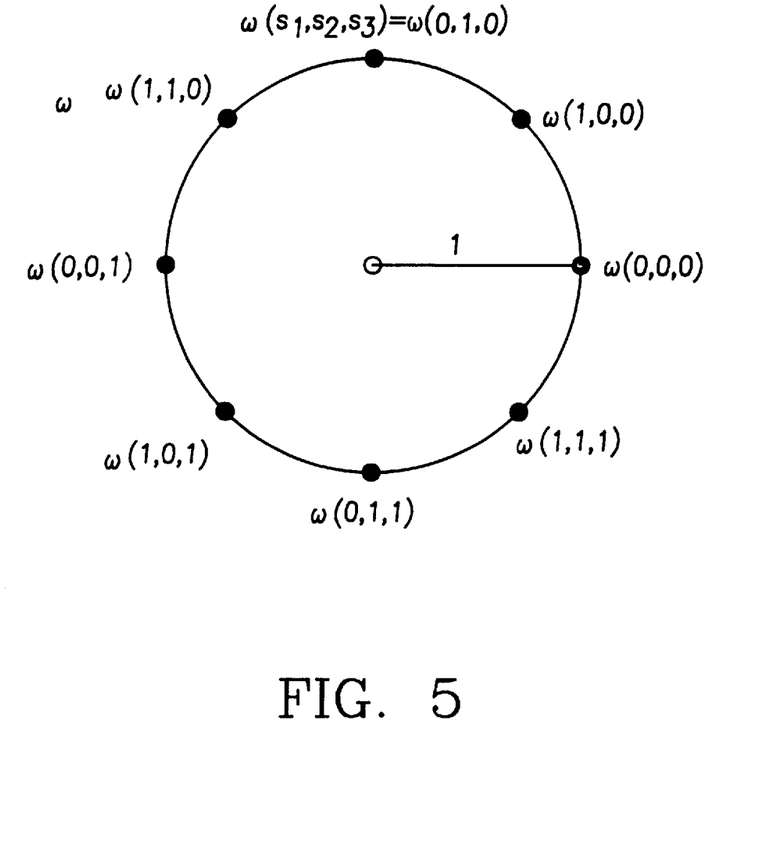
FIG. 5 shows an 8PSK signal constellation.

If $\Omega$ is a signal constellation then $\Delta(z,z')$ stands for the squared Euclidean distance between z and z', i.e., $D^2(z,z')$; and if $\Omega$ is a collection of binary m-tuples then $\Delta(z, z')$ stands for the Hamming distance between the binary representations of z and z', i.e., $d(z, z')$. It can be said that the distance structure of the signal space is $\{\Delta_1, \Delta_2, \ldots, \Delta_m\}$. For example, the 8PSK signal constellation can be partitioned into a three-level structure as shown in FIG. 5, for which the distance structure is described by $$\Delta_1 = D_1^2 = 0.586, \Delta_2 = D_2^2 = 2, \Delta_3 = D_3^2 = 4.$$

Moreover, for example, the collection of binary two-tuples $\Omega=\{0,1\}^2=\{z_0=(0,0), z_1=(1,0), z_2=(0,1), z_3=(1,1)\}$ can be partitioned as $$\begin{aligned}\Omega &= \{z_0, z_1, z_2, z_3\} \\ &= \{\omega(\tilde{s}_0)=\omega(0,0)=z_0, \omega(\tilde{s}_1)=\omega(1,0)=z_1, \\ &\quad \omega(\tilde{s}_2)=\omega(0,1)=z_3, \omega(\tilde{s}_3)=\omega(1,1)=z_2\}\end{aligned}$$

The distance structure for $\Omega$ is described by $$\begin{aligned}\Delta_1 = d_1 &= \min\{d(z,z'): z,z'\in\Omega, z\neq z'\} = 1, \\ \Delta_2 = d_2 &= \min\{d(z,z'): z,z'\in\Omega, z\neq z', \text{ and } s_1=s'_1\} \\ &= \min\{d(\omega(\tilde{s}_0),\omega(\tilde{s}_2)), d(\omega(\tilde{s}_1),\omega(\tilde{s}_3))\} \\ &= \min\{d(z_0,z_3), d(z_1,z_2)\} = 2.\end{aligned}$$

Consider the proposed trellis code T with the signal space $\Omega$. Suppose that for each i there is at most one $a_i^{(p,q)}=1$ for all $1\leq p\leq m$ and $1\leq q\leq m$. In the decoding, the bit metric can be calculated from the received sequence $\bar{y}=\{\ldots, y(t), \ldots, y(t+\Lambda-1), y(t+\Lambda)\}$ by $$M_{v_p(t)} = \sum_{q=1}^{m} \left\{ \sum_i a_i^{(p,q)} \min \left\{ \Delta(y(t+i\lambda), \omega(s)): \right. \right. \quad (4)$$

$$s_1 = \sum_{h=1}^{m}\sum_{j=0} a_j^{(h,1)} v_h(t+[i-j]\lambda),$$

$$s_2 = \sum_{h=1}^{m}\sum_{j=0} a_j^{(h,2)} v_h(t+[i-j]\lambda),$$

$$\vdots$$

$$\left.\left. s_m = \sum_{h=1}^{m}\sum_{j=0} a_j^{(h,m)} v_h(t+[i-j]\lambda) \right\} \right\}$$

where $y(t)$ is the possibly noise-corrupted form of the transmitted symbol $\omega(\tilde{s}(t))$. Note that the minimum value in the equation (4) is determined under the m constraints on the parameters, $s_1, \ldots, s_m$, i.e., $s_k=\sum_{h=1}^{m}\sum_{j=0} a_j^{(h,k)} v_h(t+[i-j]\lambda)$ for $k=1,2,\ldots,m$. In general, not all of these m constraints can be set, since there may exist $s_k$ which is determined by $v_h(t+[i-j]\lambda)$ that is not yet recovered. For each k, if the constraint on Sk can not be set, we may remove the constraint on $s_k$ in equation (4). However, in many cases, we may design schemes such that all the parameters $s_k$, $1\leq k<q$ can be determined by the previously recovered results. Then, the branch metric $M_v(t)$ which is needed to decode trellis code T using the trellis of C can be easily calculated by summing the bit metrics of $M_{v_1(t)}, \ldots, M_{v_m(t)}$.

With a proper design of the transfer function matrix, the free distance of T can be very large while the constraint length of C remains small. In the following, a design of the transfer function matrix for the trellis code T with an m-level form is given.

Let $l_1 = \zeta_1 = 0$ and let $l_2, l_3, \ldots, l_m, \zeta_2, \zeta_3, \ldots$, be nonnegative constants. Let $r_p = \sum_{i=p+1}^{m}(l_i + \zeta_i)$ for $p = 1, 2, \ldots, m-1$ and $r_m = 0$. Set $$g^{(p,p-1)}(X) = \begin{cases} 0, & p = 2, 3, \ldots, m, l_p = 0, \\ X^{(\tau_p + \zeta_p + m - p)\lambda}(X^\lambda + \ldots + X^{l_p \lambda}), & p = 2, 3, \ldots, m, l_p > 0; \end{cases}$$

$$g^{(p,p)}(X) = X^{(\tau_p + m - p)\lambda}, \quad p = 1, 2, \ldots, m;$$

$$g^{(p,q)}(X) = 0, \quad \text{otherwise.}$$

(5)

During the t-th time unit of encoding, the output of the convolutional processor is $\tilde{s}(t) = (s_1(t), s_2(t), \ldots, s_m(t))$, where $$\begin{aligned}
s_m(t) &= v_m(t); \\
s_{m-1}(t) &= \left( \sum_{i=1}^{l_m} v_m(t - [\zeta_m + i]\lambda) \right) + v_{m-1}(t - [\zeta_m + l_m + 1]\lambda) \\
&\vdots \\
s_{m-j}(t) &= \left( \sum_{i=1}^{l_{m-j+1}} v_{m-j+1}(t - [\tau_{m-j+1} + \zeta_{m-j+1} + j - 1 + i]\lambda) \right) + v_{m-j}(t - [\tau_{m-j} + j]\lambda); \\
&\vdots \\
s_1(t) &= \left( \sum_{i=1}^{l_2} v_2(t - [\tau_2 + \zeta_2 + m - 2 + i]\lambda) \right) + v_1(t - [\tau_1 + m - 1]\lambda).
\end{aligned}$$

(6)

Consider the following example. Let m=3 and $\bar{v} = (\ldots, (000), (000), (000), \ldots)$ and $\bar{v}' = (\ldots, (000), \tilde{v}'(t) = (100), \tilde{v}'(t+1) = (110), \tilde{v}'(t+2) = (111), (000), \ldots)$. Let $g^{(1,1)}(X) = X^{4\lambda}$, $g^{(2,1)}(X) = X^{3\lambda}$, $g^{(2,2)}(X) = X^\lambda$, $g^{(3,3)}(X) = 1$ and $g^{(p,q)}(X) = 0$ otherwise. Setting $\lambda = 3$, the sequences $\bar{v}$ and $\bar{v}'$ are converted into sequences $\bar{s}$ and $\bar{s}'$, which are respectively given by $$\bar{s} = \begin{bmatrix} \ldots & 0 & 0\,0 & 0 & 0\,0\,0\,0\,0 & 0 & 0\,0\,0\,0\,0\,0 & \ldots \\ \ldots & 0 & 0\,0 & 0 & 0\,0\,0\,0\,0 & 0 & 0\,0\,0\,0\,0\,0 & \ldots \\ \ldots & 0 & 0\,0 & 0 & 0\,0\,0\,0\,0 & 0 & 0\,0\,0\,0\,0\,0 & \ldots \end{bmatrix} \begin{matrix} s_1 \\ s_2 \\ s_3 \end{matrix}$$

with $\tilde{s}(t)$, $\tilde{s}(t+3)$, $\tilde{s}(t+9)$ marking the columns, and $$\bar{s}' = \begin{bmatrix} \ldots & 0 & 0\,0 & 0 & 0\,0\,0\,0\,0 & 0 & 1\,1\,1\,1\,1\,0 & \ldots \\ \ldots & 0 & 0\,0 & 0 & 1\,1\,0\,0\,0 & 0 & 0\,0\,0\,0\,0\,0 & \ldots \\ \ldots & 0 & 0\,1 & 0 & 0\,0\,0\,0\,0 & 0 & 0\,0\,0\,0\,0\,0 & \ldots \end{bmatrix} \begin{matrix} s'_1 \\ s'_2 \\ s'_3 \end{matrix}$$

with $\tilde{s}'(t)$, $\tilde{s}'(t+3)$, $\tilde{s}'(t+9)$ marking the columns.

Then, using the 8PSK signal constellation, $$D^2(\omega(\tilde{s}(t+2)), \omega(\tilde{s}'(t+2))) = D_3^2 =$$

$$4, D^2(\omega(\tilde{s}(t+4)), \omega(\tilde{s}'(t+4))) = D^2(\omega(\tilde{s}(t+5)), \omega(\tilde{s}'(t+5))) =$$

$$D_2^2 = 2, D^2(\omega(\tilde{s}(t+i)), \omega(\tilde{s}'(t+i))) = D_1^2 = 0.586$$

for i=10,11,12,13,14. Thus, $\Delta(\bar{\omega}, \bar{\omega}') = D^2(\bar{\omega}, \bar{\omega}') = 0.586 \times 5 + 2 \times 2 + 4 \times 1 = 10.93$.

The free distance of T, denoted by $\Delta_{free}$, is the smallest one of all the possible distances, each of which is measured between any pair of two distinct symbol sequences $\bar{\omega}$ and $\bar{\omega}'$ of T, i.e., $$\Delta_{free} = \min_{\substack{\bar{\omega} \neq \bar{\omega}' \\ \bar{\omega}, \bar{\omega}' \in T}} \Delta(\bar{\omega}, \bar{\omega}').$$

Note that if the signal space is a signal constellation then $\Delta_{free}=D_{free}^2$ is the squared free distance of T which is the smallest one of all the possible squared distances, each of which is measured between any pair of distinct symbol sequences of T. If the signal space is a collection of binary m-tuples then $\Delta_{free}=d_{free}$ is the free distance of T which is the smallest one of all the possible Hamming distances each of which is measured between binary representations of any pair of distinct symbol sequences of T.

For $2 \leq p \leq m$, let $l_p > \lfloor \Delta_p/\Delta_{p-1} \rfloor$. Moreover, let $\zeta_p \geq \zeta_{p-1} + l_p$ if $l_p > 0$ and $\zeta_p = 0$ if $l_p = 0$. If the convolutional code C is not catastrophic, by taking $\lambda$ to be a large enough number, it can be shown that the free distance of the trellis code T is $$\Delta_{free} \geq \min_{\bar{v} \neq \bar{v}'; \bar{v}, \bar{v}' \in C} \left\{ \sum_{t} \sum_{j=1}^{m} [d(v_j(t), v'_j(t)) \cdot (\Delta_j + l_j\Delta_{j-1})], \right\}. \quad (7)$$

Figure 6:
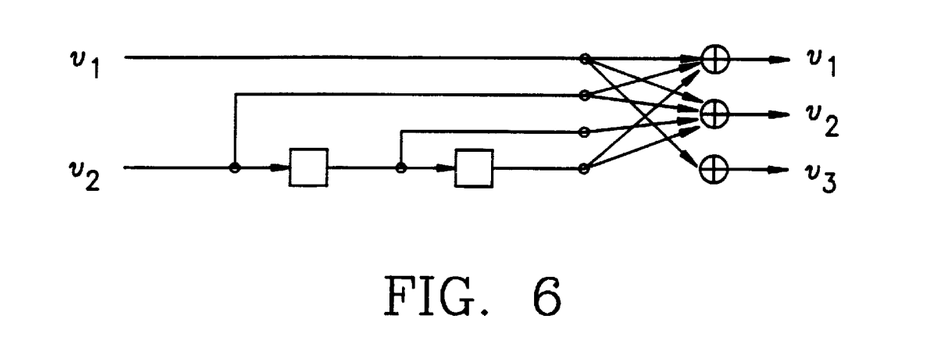
FIG. 6 illustrates the encoder E of the linear binary convolutional code C used in the first embodiment.
Figure 7:
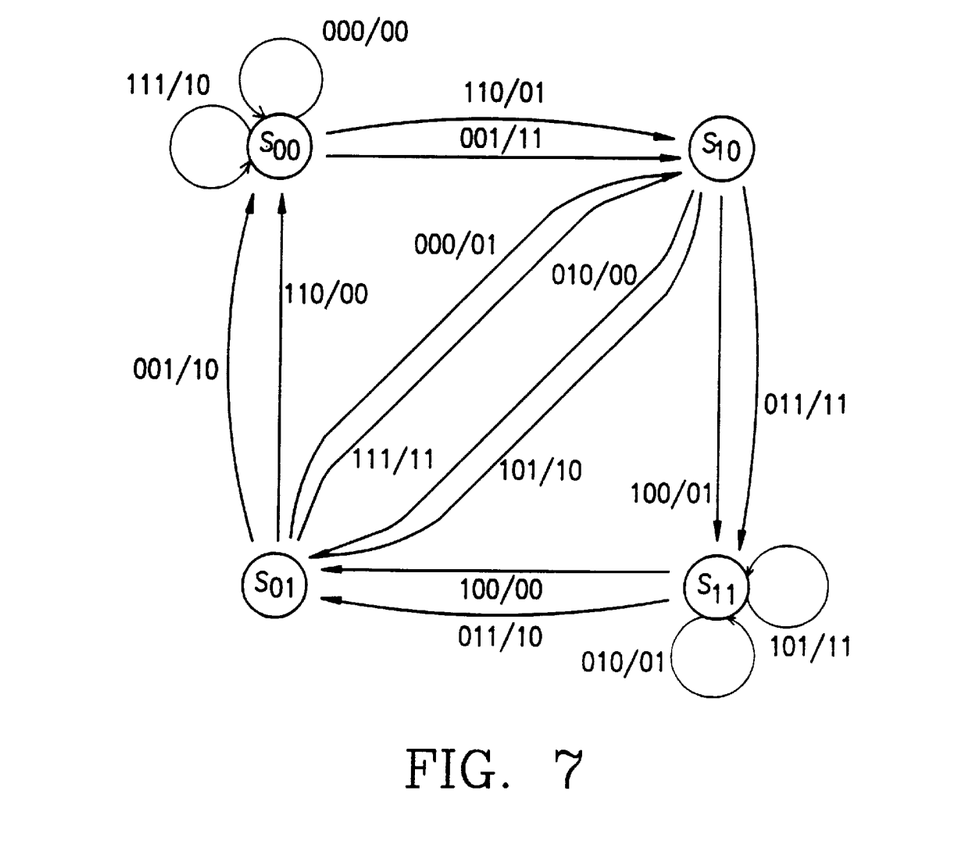
FIG. 7 illustrates the state transition diagram of the linear binary convolutional code C used in the first embodiment.
Figure 8:
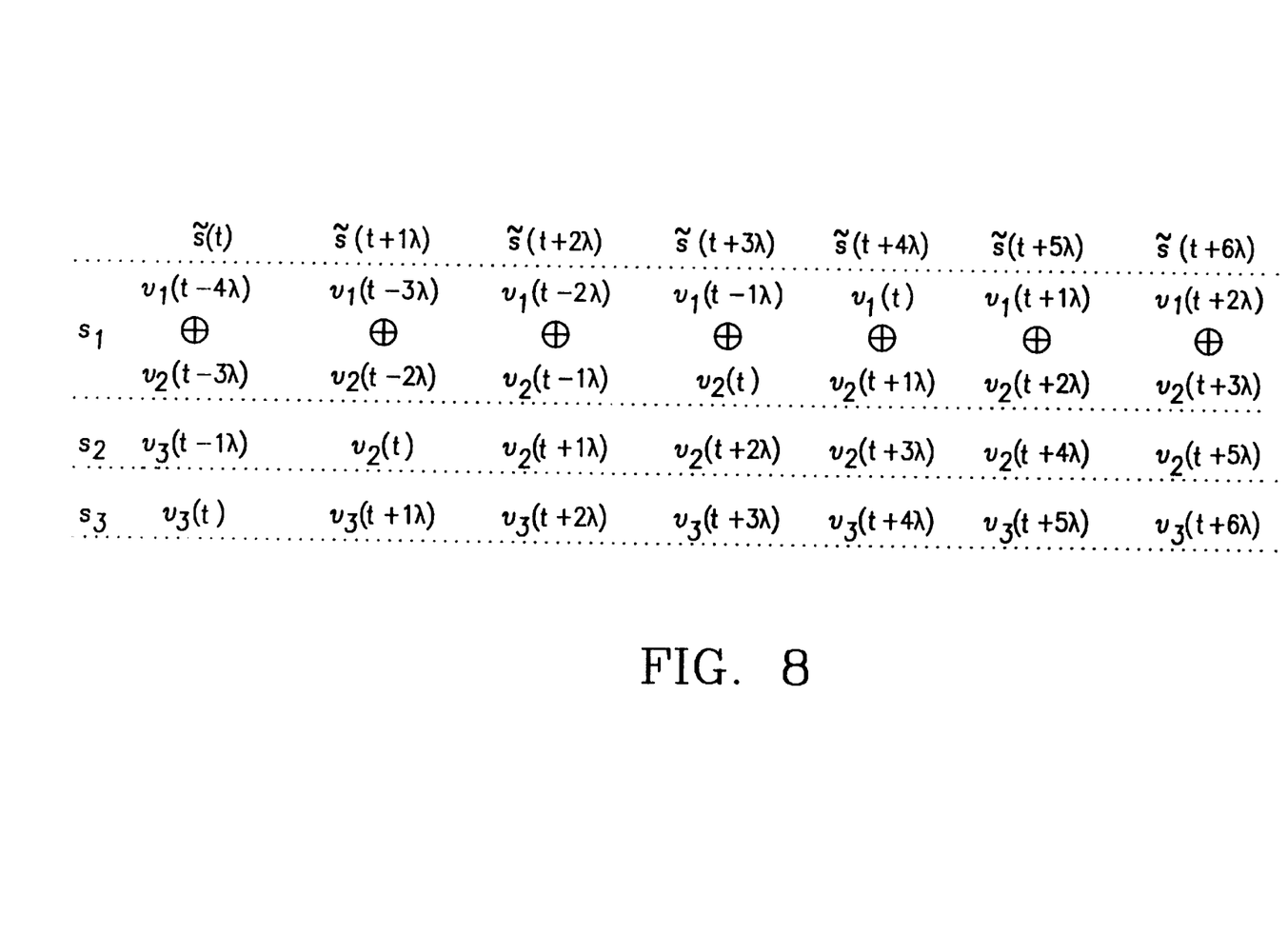
FIG. 8 illustrates the relation between $\tilde{v}(t)$ and $\tilde{s}(t)$ for the first embodiment.

Consider the following embodiment which is an 8PSK TCM using a 4-state binary convolutional code C. The encoder and the state diagram of code C are given in FIG. 6 and FIG. 7 respectively. The transfer function matrix of the convolutional processor is G with $g^{(1,1)}(X)=X^{4\lambda}$, $g^{(2,1)}(X)=X^{3\lambda}$, $g^{(2,2)}(X)=X^\lambda$, $g^{(3,3)}(X)=1$ and $g^{(p,q)}(X)=0$ otherwise. It can be checked that the path with the smallest free distance from the all zero path is the nonzero self-loop around the state $S_{00}$ as shown in FIG. 7. The squared free distance of the TCM is then $\Delta_{free}=D_{free}^2=0.586+2+2+4=7.17$. The decoding for this TCM needs to use the trellis for the binary convolutional code C. The relation between $\tilde{s}(t)$ and $\tilde{v}(t)$ is shown in FIG. 8. At the $(t+4\lambda)$-th time unit of decoding, $\tilde{y}(t+4\lambda)$, $\tilde{y}(t+4\lambda-1)$, and $\tilde{y}(t+4\lambda-2)$, ... are already received. We assume that $\tilde{v}(t-i)$ has already been correctly recovered for $i \geq \lambda$. The decoding consists of the following steps.

Step 1: We calculate the metric $M_{v_3(t)}$ for each $v_3(t) \in \{0,1\}$ by $\min\{\Delta(\tilde{y}(t),\omega(\tilde{s})): s_1 = v_1(t-4\lambda) + v_2(t-3\lambda), s_2 = v_2(t-\lambda), s_3 = v_3(t)\}$.

Step 2: We calculate the metric $M_{v_2(t)}$ for each $v_2(t) \in \{0,1\}$ by $\min\{\Delta(\tilde{y}(t+\lambda),\omega(\tilde{s})): s_1 = v_1(t-3\lambda) + v_2(t-2\lambda), s_2 = v_2(t), s_3 \in \{0,1\}\} + \min\{\Delta(\tilde{z}(t+3\lambda),\omega(\tilde{s})): s_1 = v_1(t-\lambda) + v_2(t), s_2 \in \{0,1\}, s_3 \in \{0,1\}\}$ Step 3: We calculate the metric $M_{v_1(t)}$ for each $v_1(t) \in \{0,1\}$ by $\min\{\Delta(\tilde{z}(t+4\lambda),\omega(\tilde{s})): s_1 = v_1(t) + v_2(t+\lambda), s_2 \in \{0,1\}, s_3 \in \{0,1\}\}$, where $v_2(t+\lambda)$ is estimated to be equal to $s_2$ which minimizes $\alpha(\tilde{z}(t+2\lambda),\omega(\tilde{s}))$ with $s_1 = v_1(t-2\lambda) + v_2(t-\lambda)$.

Step 4: By summing $M_{v_1(t)}$, $M_{v_2(t)}$ and $M_{v_3(t)}$, we have the branch metric $M_{\tilde{v}}(t)$. Then, we use the 4-state decoding trellis of the convolutional code C with a decoding truncation length of $\lambda$ to recover $\tilde{v}(t-\lambda+1)$. The decoding procedure is then back to step 1.

Figure 9:
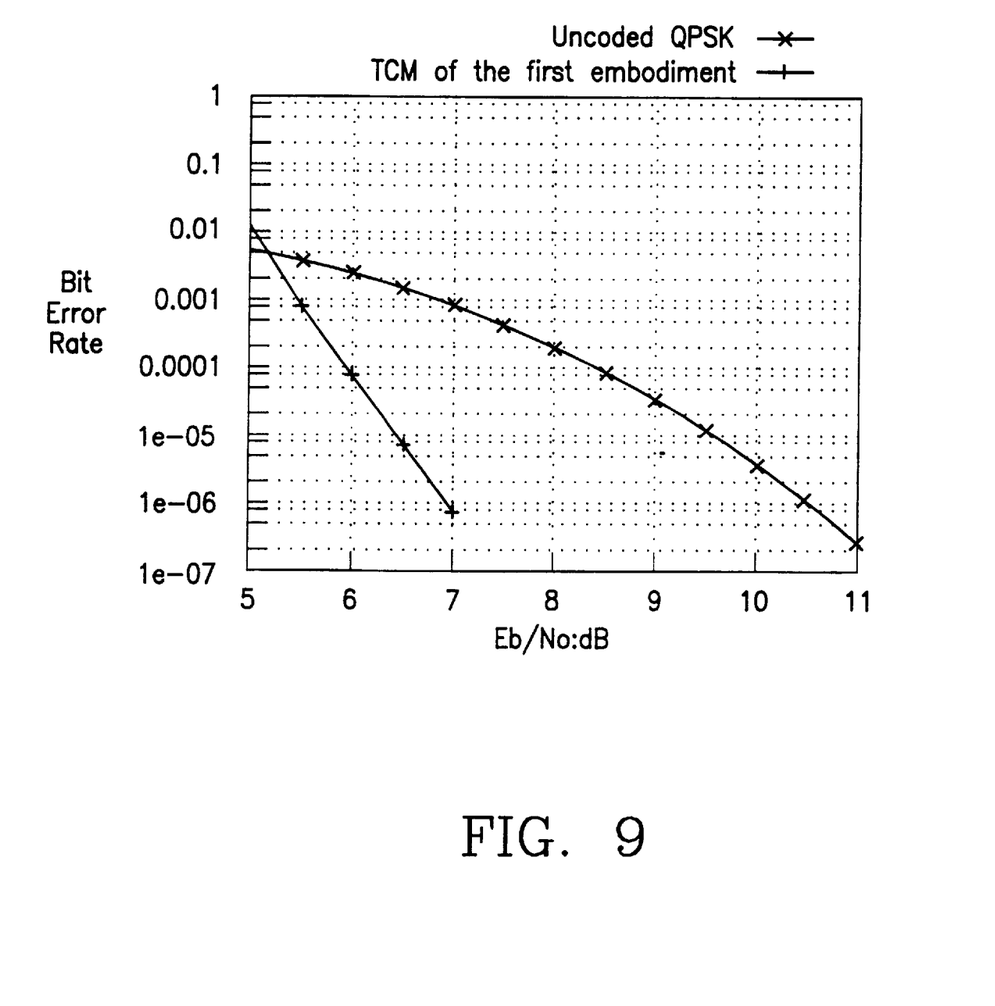
FIG. 9 illustrates the simulation results for the first embodiment.

Simulation results for the embodiment using the above decoding method are given in FIG. 9, where $\lambda=30$. We see that a coding gain of about 3.5 dB over the uncoded QPSK is achieved at bit error rate of $10^{-6}$.

Finally, the binary convolutional code C used in encoding and decoding T can be replaced by the more general binary trellis code, or the encoder of the trellis code C can be replaced by encoders of a plurality of trellis codes which together convert $\bar{u}(t)$ into $\bar{v}(t)$, and which is then processed by the convolutional processor P and the signal mapper S; the Viterbi algorithm for C used in the processor $P^{(1)}$ being replaced by a plurality of Viterbi algorithms for the plurality of trellis codes.

As an alternative to summing bit metrics $M_{v_1(t)}, \ldots, M_{v_m(t)}$ to calculate $M_{\tilde{v}}(t)$ in the situation where symbol $\tilde{v}(t)$ is a binary m-tuple which can be expressed by $\tilde{v}(t) = (v_1(t), \ldots, v_m(t))$, the branch metric $M_{\tilde{v}}(t)$ may also be calculated by summing metrics $M_{\tilde{x}_1(t)}, \ldots, M_{\tilde{x}_L(t)}$, $1 < L < m$, where $M_{\tilde{x}_j(t)}$, $1 \leq j \leq L$, is calculated based on $\tilde{y}(t+i\lambda)$, and $i$ is determined by a corresponding transfer function matrix.

In addition, it will be appreciated that the information symbol $\bar{u}(f)$ can be replaced by l information symbols, i.e., $\tilde{u}(t), \tilde{u}(t+1/l), \ldots, \tilde{u}(t+(l-1)/l)$; the output branch symbol of C, $\bar{v}(t)$ can be replaced by l output branch symbols of C, i.e., $\tilde{v}(t), \tilde{v}(t+(1/l)), \ldots, \tilde{v}(t+(l-1)/\lambda)$; the output symbol of P, $\tilde{s}(t)$ can be replaced by l' output branch symbols of P, i.e., $\tilde{s}(t), \tilde{s}(t+1/l'), \ldots, \tilde{u}(t+(l'-1)/l'))$; and the output symbol of S, $\omega(\tilde{s}(t+(l'-1)/l'))$ can be replaced by l' output branch symbols of P, i.e., $\omega(\tilde{s}(t)), \omega(\tilde{s}(t+1/l')), \ldots, (\tilde{s}(t+(l'-1)/l'))$, where l and l' are positive integers.

What is claimed is:

1. A decoding method for a trellis code T for which the encoding can be implemented by feeding an information sequence $\bar{u} = \{\ldots, \tilde{u}(t-1), \bar{u}(t), \ldots\}$ into an encoder of a convolutional code C followed by a convolutional processor P and a signal mapper S for generating output sequences $\bar{v} = \{\ldots, \bar{v}(t-1), \tilde{v}(t), \ldots\}$, $\bar{s} = \{\ldots, \tilde{s}(t-1), \tilde{s}(t), \ldots\}$, and $\bar{\omega} = \{\ldots, \omega(\tilde{s}(t-1)), \omega(\tilde{s}(t)), \ldots\}$ respectively, wherein $\bar{u}(t)$ is an information symbol to be encoded during a t-th time unit, $\bar{v}(t)$ is an associated output branch symbol of the encoder of C, $\tilde{s}(t)$ is an associated output symbol of P, and $\omega(\tilde{s}(t))$ is an associated output symbol of S which represents a signal point of a signal space $\Omega$, and wherein the convolutional processor P is characterized by a transfer function matrix $G = [G^{(p,q)}(X)]$ with $G^{(p,q)}(X) \neq 0$ for some $p \neq q$, comprising the decoding steps of:

(a) Determining, in a processor $P^{(2)}$, a branch metric $M_{\bar{v}}(t)$ for each of the possible $\bar{v}(t)$ based on the received sequence $\bar{y} = \{\ldots, y(t-1), y(t), \ldots, \}$, the transfer function matrix G, and the previously recovered symbols $\tilde{v}(t-1)$, $i \geq \lambda$, wherein $\lambda$ is a positive constant and $y(t)$ is a possibly noise-corrupted form of $\omega(\tilde{s}(t))$;

(b) Applying, in a processor $P^{(1)}$, the Viterbi algorithm to the trellis of C to recover $\tilde{u}(t-\lambda+1)$ and $\tilde{v}(t-\lambda+1)$ based on a metric sequence $\{\ldots, T_{M(t-1)}, T_{M(t)}\}$, wherein $T_{M(t)}$ is a set consisting of $M_{\bar{v}}(t)$ for all the possible $\bar{v}(t)$.

2. A decoding method as in claim 1, wherein said convolutional code C is replaced by a trellis code also denoted by C.

3. A decoding method as in claim 2, wherein said encoder of the trellis code C is replaced by encoders of a plurality of trellis codes which together convert $\tilde{u}(t)$ into $\tilde{v}(t)$, which is then processed by the convolutional processor P and the signal mapper S; and said Viterbi algorithm for C used in the processor $p^{(1)}$ is replaced by a plurality of Viterbi algorithms for said plurality of trellis codes.

4. A decoding method as in claims 2 or 3, wherein said transfer function matrix is $G = [g^{(p,q)}(X)]$, $p,q \in \{1, 2, \ldots, m\}$ such that $$g^{(p,q)}(X) = \begin{cases} 0, & p = 1, 2, \ldots, m, p < q, \\ \sum_{i=1}^{} a_i^{(p,q)} X^{i\lambda + n_p}, & p = 2, 3, \ldots, m, p > q; \end{cases} \quad (8)$$

$$g^{(p,p)}(X) = X^{r_p\lambda + n_p}, \quad p = 1, 2, \ldots, m;$$

wherein $\alpha_i^{(p,q)} \in \{0,1\}$, $r_p$ and $n_p$ are nonnegative constants, and $r_1 + n_1 \geq r_2 + n_2 \geq \ldots \geq r_m + n_m$.

5. A decoding method as in claims 2 or 3, wherein said symbol $\tilde{v}(t)$ is a binary m-tuple which can be expressed by $\tilde{v}(t) = (v_1(t), \ldots, v_m(t))$, and said branch metric $M_{\bar{v}}(t)$ is calculated by summing bit metrics $M_{v_1(t)}, \ldots, M_{v_m(t)}$ up, in which $M_{v_j(t)}$, $1 \leq j \leq m$, is calculated based on $y(t+i\lambda)$ with i determined by said transfer function matrix.

6. A decoding method as in claim 2 or 3, wherein said symbol $\tilde{v}(t)$ is a binary m-tuple, which is expressed by $\tilde{v}(t)=(v_1(t),\ldots,v_m(t))[=(\tilde{x}_1(t),\ldots,\tilde{x}_L(t)), 1<L<m]$, and said branch metric $M_{\tilde{v}(t)}$ is calculated by summing metrics $M_{\tilde{x}_1(t)}, \ldots, M_{\tilde{x}_L(t)}$, $1<L<m$, with $M_{\tilde{x}_j(t)}$, $1 \leq j \leq L$, being calculated based on $y(t+i\lambda)$ and i being determined by said transfer function matrix.

7. A decoding method as in claims 2 or 3, wherein the signal space $\Omega$ is a signal constellation and said trellis code T is be a trellis coded modulation.

8. A decoding method as in claims 2 or 3, wherein the signal space $\Omega$ is a collection of binary m-tuples and said trellis code T is a binary trellis code.

9. A decoding method as in claims 1 or 2, wherein said information symbol $\tilde{u}(t)$ is replaced by l information symbols, i.e., $\tilde{v}(t), \tilde{u}(t+(1/l)), \ldots, \tilde{u}(t+(l-1)/l)$; and said output branch symbol of C, $\tilde{v}(t)$, is replaced by l output branch symbols of C, i.e., $\tilde{v}(t), \tilde{v}(t+1/l), \ldots, \tilde{v}(t+(l-1)/l)$; and said output symbol of P, $\tilde{s}(t)$, is replaced by l' output symbols of P, i.e., $\tilde{s}(t), \tilde{s}(t+1/l'), \ldots, \tilde{s}(t+(l-1)/l)$; and said output symbol of S, $\omega(\tilde{s}(t))$, is replaced by l' output symbols of S, i.e., $\omega(\tilde{s}(t)), \omega(\tilde{s}(t+1/l')), \ldots, \omega(\tilde{s}(t+(l'-1)/l'))$, where l and l' are positive integers.

* * * * *